United States Patent [19]

Levy

[11] Patent Number: 5,715,423
[45] Date of Patent: Feb. 3, 1998

[54] MEMORY DEVICE WITH AN INTERNAL DATA TRANSFER CIRCUIT

[75] Inventor: Markus A. Levy, Citrus Heights, Calif.

[73] Assignee: Intel Corporation, Santa Clara, Calif.

[21] Appl. No.: 229,454

[22] Filed: Apr. 18, 1994

[51] Int. Cl.$^6$ ............................................. G06F 12/06
[52] U.S. Cl. ................................. 395/430; 395/430
[58] Field of Search ........................ 395/427, 428, 395/429, 430, 492, 481; 365/229, 189.04

[56] References Cited

U.S. PATENT DOCUMENTS

| | | |
|---|---|---|
| 4,642,759 | 2/1987 | Foster . |
| 4,879,685 | 11/1989 | Takemae ............................ 365/189 |
| 4,905,140 | 2/1990 | Sakakibara ......................... 395/430 |
| 5,065,364 | 11/1991 | Atwood et al. . |
| 5,131,089 | 7/1992 | Cole . |
| 5,197,034 | 3/1993 | Fandrich et al. . |
| 5,222,046 | 6/1993 | Kreifels et al. . |
| 5,224,070 | 6/1993 | Fandrich et al. . |
| 5,359,569 | 10/1994 | Fujita ............................... 365/229 |
| 5,438,549 | 8/1995 | Levy ................................. 365/229 |
| 5,448,712 | 9/1995 | Kynett ............................... 395/430 |
| 5,488,711 | 1/1996 | Hewitt ............................... 395/430 |

FOREIGN PATENT DOCUMENTS 0392895  10/1990  European Pat. Off. .

OTHER PUBLICATIONS

Stevens, "Recalibration Affects Recording on Hard Drives" MacWeek, Nov. 16, 1992, vol. 6, No. 41, p. 70.
Momodomi, "A High Density NAND EEPROM w/Block-Page Programming for Microcomputer Applications", IEEE 1989 Custom Integrated Circuits Conference.

*Primary Examiner*—Tod R. Swann
*Assistant Examiner*—Christopher S. Chow
*Attorney, Agent, or Firm*—Blakely, Sokoloff, Taylor & Zafman

[57] ABSTRACT

A memory that resides on a single substrate includes (1) a memory array having a first block and a second block and (2) control circuitry coupled to the memory array for performing memory operations with respect to the memory array. A data transfer circuit is provided in the memory that is coupled to the control circuitry and is responsive to a data transfer command received from an external circuit. The data transfer circuit controls the control circuitry to perform a data transfer operation to transfer data from the first block to the second block. The data is first read from the first block of the memory. The data read from the first block of the memory is then stored in a buffer of the memory. The data stored in the buffer is then written into the second block of the memory such that the data is transferred from the first block of the memory device to the second block of the memory device without leaving the memory. A method of transferring data within the memory is also described.

16 Claims, 5 Drawing Sheets

MEMORY DEVICE WITH AN INTERNAL DATA TRANSFER CIRCUIT

FIELD OF THE INVENTION

The present invention pertains to the field of computer memories. More particularly, this invention relates to a memory device that includes an internal data transfer circuit for transferring data from one storage area of the memory device to another internally such that time and external system resources required to accomplish the internal data transfer are minimized.

BACKGROUND OF THE INVENTION

A prior art computer system typically includes a microprocessor (also referred to as a central processing unit ("CPU")), that is connected to several types of storage systems. These storage systems typically include a read only memory ("ROM"), a random access memory ("RAM"), and a flash erasable and electrically programmable read only memory ("flash EPROM"). As is known, a flash EPROM is a nonvolatile memory that can be electrically programmed and erased. Once programmed, the flash EPROM stores the data programmed until they are erased. FIG. 1 illustrates such a prior art computer system 10.

As can be seen from FIG. 1, a CPU 11 controls the read from a flash EPROM 15. Data is sent to or obtained from flash EPROM 15 via a bus 14. When data stored in one area of flash EPROM 15 needs to be transferred to another area within flash EPROM 15, CPU 11 typically needs to read the data from flash EPROM 15 and then write that data to a system RAM 12 via bus 14 or into a CPU register. System RAM 12 can also be a RAM buffer. The data buffered in RAM 12 or the CPU register is then read from RAM 12 or the CPU register and then written to the new storage area of flash EPROM 15. This is done under the control of CPU 11. CPU 11 can either read the entire data before writing the data back into flash EPROM 15, or read a portion of the data and then write the portion of data back into flash EPROM 15 before reading another portion of the data from flash EPROM 15. One disadvantage associated with such a prior art computer system is that the transfer of data from one area of the flash EPROM to another requires a number of memory operations by the CPU. This typically causes the CPU's processing time to be relatively long. In addition, the system bus used to transfer the data may not be fast enough, which may also cause the data transfer to be relatively time consuming.

Another disadvantage associated with such prior a prior art computer system is that the system bus is typically used to transfer the data twice in order for the CPU to transfer the data from one storage area to another storage area within the flash EPROM. This typically causes the resources of the system bus to be wasted.

SUMMARY AND OBJECTS OF THE INVENTION

One of the objects of the present invention is to provide a memory device with an internal data transfer mechanism such that data stored in the memory device can be transferred inside the memory device from one area to another.

Another object of the present invention is to provide a memory device with an internal data transfer circuit such that data stored in the memory device can be transferred from one storage area of the memory device to another without leaving the memory device.

A further object of the present invention is to provide a memory device with an internal data transfer circuit that allows data stored in the memory device to be internally transferred such that time and external system resources required to accomplish the internal data transfer are minimized.

A memory that resides on a single substrate includes (1) a memory array having a first block and a second block and (2) control circuitry coupled to the memory array for performing memory operations with respect to the memory array. A data transfer circuit is provided in the memory that is coupled to the control circuitry and is responsive to a data transfer command received from an external circuit. The data transfer circuit controls the control circuitry to perform a data transfer operation to transfer data from the first block to the second block within the memory array without transferring the data to the external circuit.

A method of transferring data within a memory device is described. The data is read from a first block of the memory device. The data read from the first block of the memory device is then stored in a buffer of the memory device. The data stored in the buffer is then written into a second block of the memory device such that the data is transferred from the first block of the memory device to the second block of the memory device without leaving the memory device.

Other objects, features, and advantages of the present invention will be apparent from the accompanying drawings and from the detailed description that follows.

BRIEF DESCRIPTION OF THE DRAWINGS

The present invention is illustrated by way of example and not limitation in figures of the accompanying drawings, in which like references indicate similar elements and in which.

DETAILED DESCRIPTION

Figure 1:
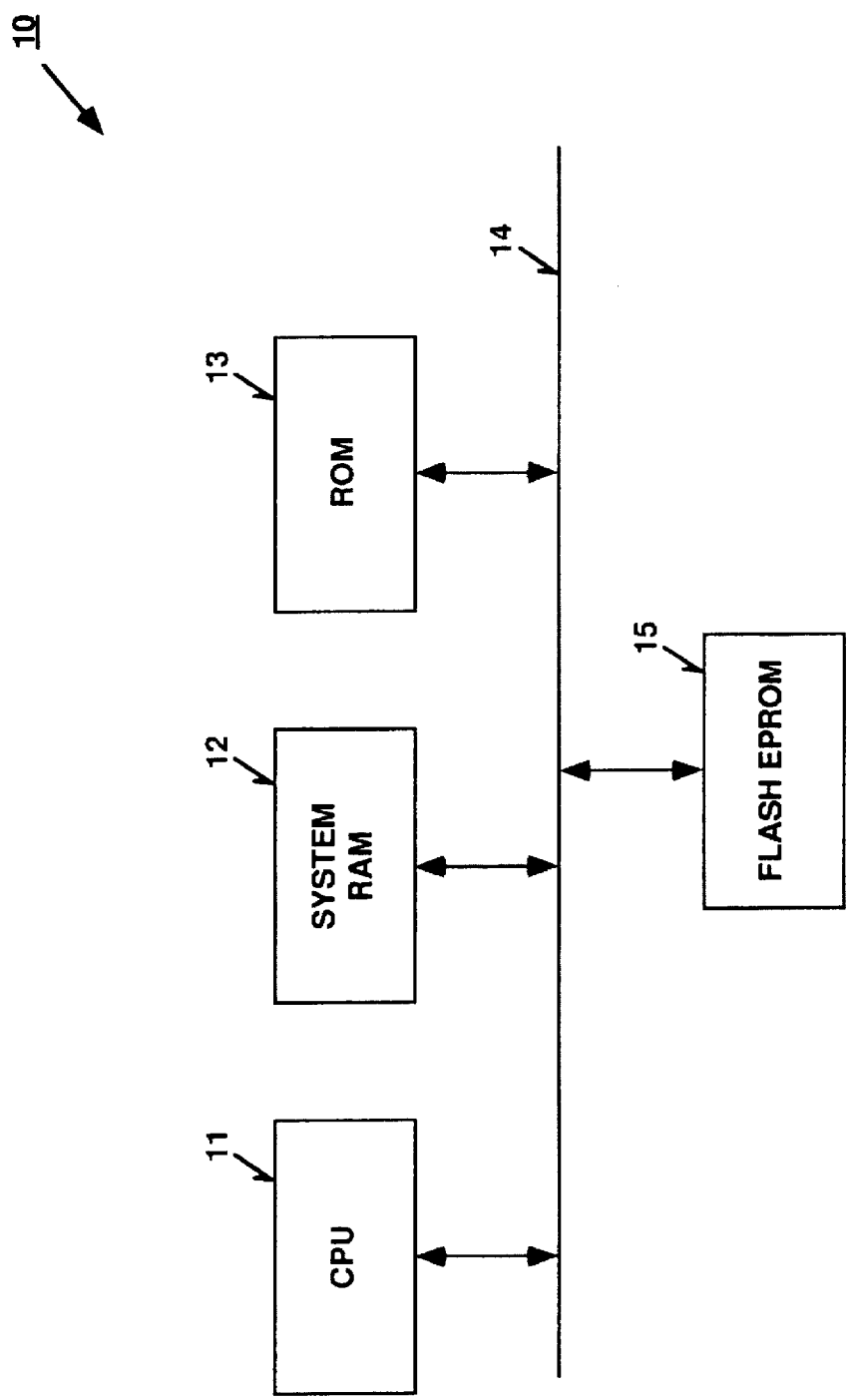
FIG. 1 is a block diagram of a prior art computer system that includes a flash EPROM.
Figure 2:
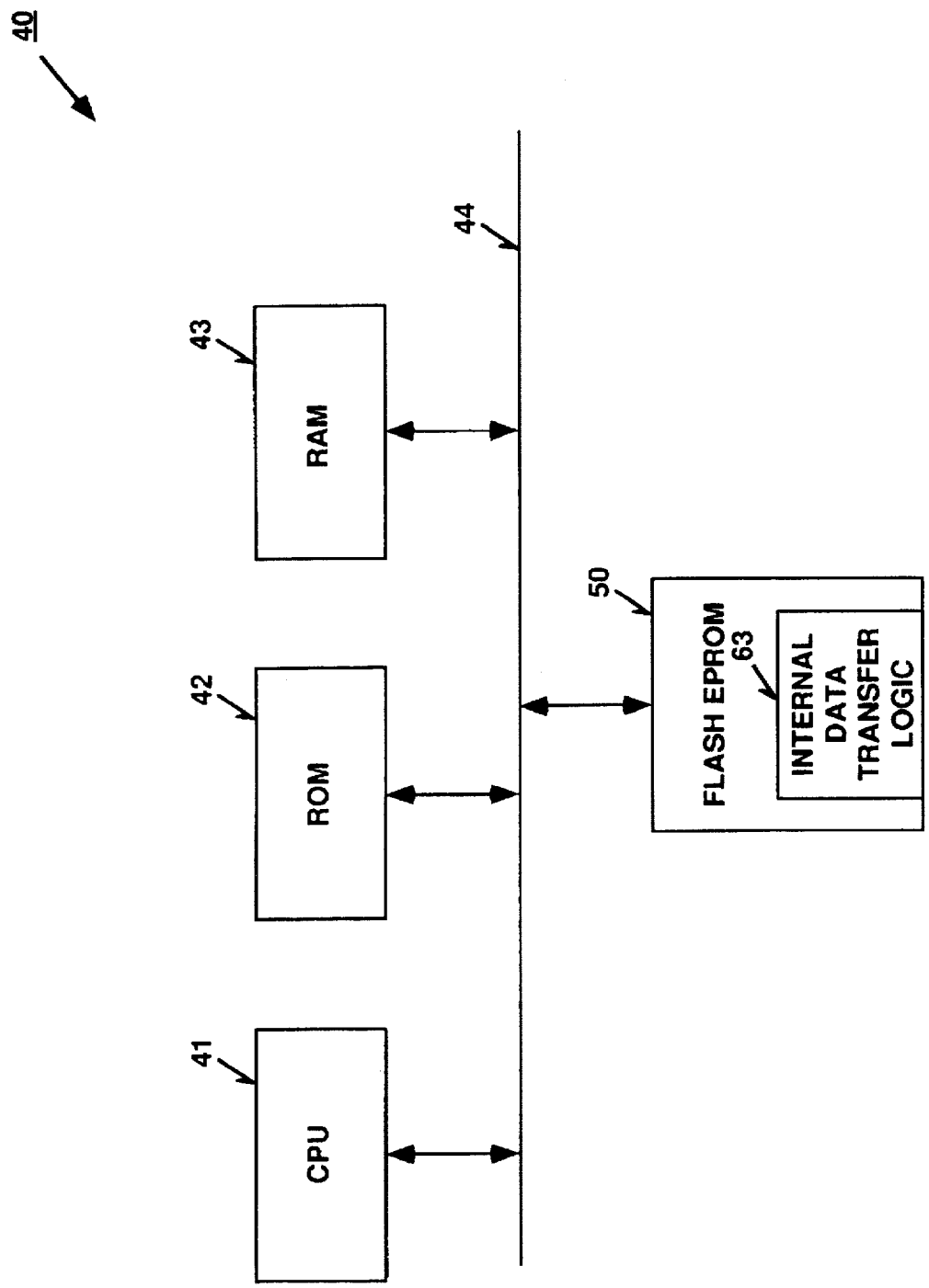
FIG. 2 is a block diagram of a computer system that includes a flash EPROM, which includes an internal data transfer logic in accordance with an embodiment of the present invention.

FIG. 2 shows the architecture of a computer system 40 that includes a flash EPROM 50 that implements an embodiment of the present invention. Flash EPROM 50 includes an internal data transfer logic 63 for transferring data from one storage area to another within flash EPROM 50.

Computer system 40 includes a bus 44 connected to a central processing unit ("CPU") 41, a ROM 42, and a RAM 43. Bus 44 is also connected to flash EPROM 50. In addition, bus 44 may also be connected to peripheral devices (not shown). The peripheral devices may include a keyboard, a display, a modem, a printer, a local area network controller, and other devices.

Figure 3:
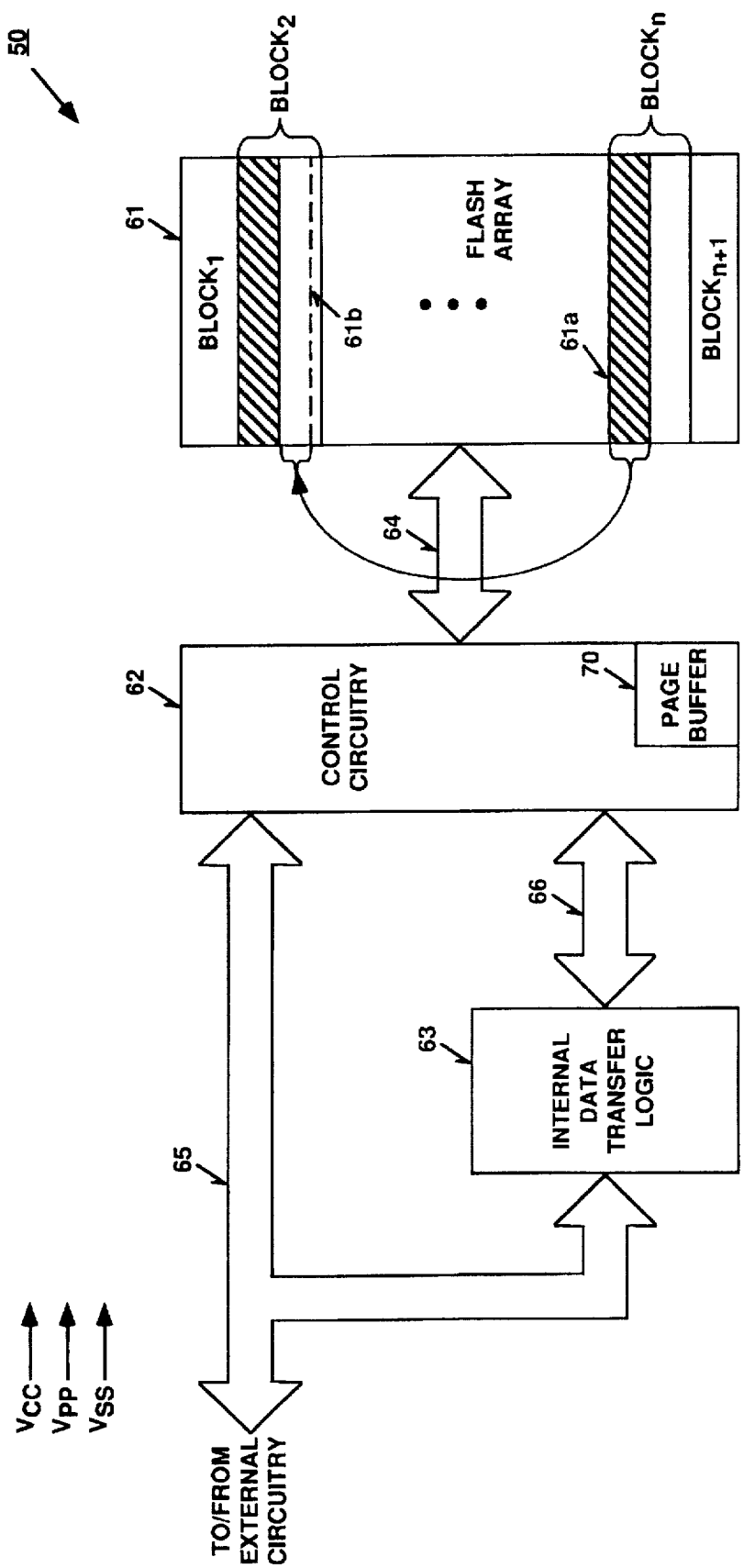
FIG. 3 is a block diagram of the flash EPROM of FIG. 2 with the internal data transfer logic.

FIG. 3 shows the circuitry of flash EPROM 50. As can be seen from FIG. 3, flash EPROM 50 includes a memory army 61 that includes a number of memory blocks BLOCK$_1$ through BLOCK$_{n+1}$. Flash EPROM 50 also includes control circuitry 62 for controlling memory operations of memory array 61. Control circuitry 62 also includes a page buffer 70 for buffering data to be written into memory array 61.

Memory array 61 of flash EPROM 50 is made up of flash EPROM cells that store data at addresses. For one embodiment, memory array 61 stores 16M bits ("megabits") of data. For alternative embodiments, memory array 61 can be smaller or larger than 16M bits. For one embodiment, each flash EPROM cell of memory array 61 can store one bit of data at one time. For alternative embodiments, each flash EPROM cell of memory array 61 may store more than one bit of data at one time. For example, each flash EPROM cell of memory array 61 can store two bits of data at one time.

For alternative embodiments, other types of memories can be substituted for flash EPROM 50. For example, an electrically erasable and programmable read only memory ("EEPROM") or a RAM can be used.

For one embodiment, memory array 61 is organized into bit line blocks by arranging bit lines into groups. For another embodiment, memory array 61 is organized into word line blocks by arranging word lines into groups.

For one embodiment, all the circuitry of flash EPROM 50 resides on a single substrate and flash EPROM 50 employs MOS circuitry.

Control circuitry 62 controls the memory operations with respect to memory array 61 via bus 64. The memory operations of flash EPROM 50 include read, programming, and erasure. When control circuitry 62 performs a read operation with respect to memory array 61, control circuitry 62 receives data read from memory array 61 via bus 64. When control circuitry 62 performs a programming operation with respect to memory array 61, control circuitry 62 sends data to be programmed to memory array 61 via bus 64. As described above, control circuitry 62 includes page buffer 70. The data to be programmed into memory array 61 is first buffered in page buffer 70. Control circuitry 62 receives the data to be programmed in memory array 61 with its associated address from external circuitry (not shown) via bus 65. Control circuitry 62 includes an address decoding circuit (not shown) that decodes the address to access the addressed memory location within memory array 61. Control circuitry 62 then applies the data from page buffer 70 to memory array 61 to be programmed into the addressed location of memory array 61.

Page buffer 70 can be implemented by a volatile memory. For one embodiment, page buffer 70 includes a RAM. For alternative embodiments, page buffer 70 can be other types of memories. For example, a static RAM can be used for page buffer 70.

The use of page buffer 70 in flash EPROM 50 increases the programming throughput of flash EPROM 50. It also enables fast access to the buffered data by control circuitry 62 during the programming operation.

$V_{PP}$ is the program/erase power supply for flash EPROM 50. $V_{PP}$ is applied to a $V_{PP}$ pin of flash EPROM 50. $V_{CC}$ is the device power supply of flash EPROM 50 and $V_{SS}$ is ground. $V_{CC}$ is applied to a $V_{CC}$ pin of flash EPROM 50 and $V_{SS}$ is applied to a $V_{SS}$ pin of flash EPROM 50.

For one embodiment, $V_{PP}$ is approximately 12 volts and $V_{CC}$ is approximately 5 volts. For another embodiment, $V_{CC}$ is approximately 3 volts. For another embodiment, flash EPROM 50 generates the $V_{PP}$ power supply internally.

Control circuitry 62 also provides configuration signals and other control signals to memory array 61 via bus 64.

Control circuitry 62 may be implemented by a dedicated processor for controlling the memory operations of memory array 61. For one embodiment, the dedicated processor is a reduced instruction set processor. For alternative embodiments, the processor may be other types of microprocessors or microcontrollers. Control circuitry 62 starts to control and perform the memory operations of flash EPROM 50 by first receiving memory operation commands from the external circuitry via bus 65.

Flash EPROM 50 also includes internal data transfer logic 63. Internal data transfer logic 63 is connected to control circuitry 62 via bus 66 and to the external circuitry via bus 65. Internal data transfer logic 63 controls control circuitry 62 to perform an internal data transfer operation of memory array 61. The internal data transfer operation transfers data stored in one area (i.e., source area) of memory array 61 to another area (i.e., destination area) of memory array 61. For example, as can be seen from FIG. 3, sector 61a of BLOCKn of memory array 61 stores data and sector 61b of BLOCK2 of memory array 61 does not store any data (i.e., spare sector). When the data stored in sector 61a needs to be transferred to spare sector 61b, the internal data transfer operation is initiated in order to transfer the data from sector 61a to sector 61b without transferring the data to the external circuitry.

Internal data transfer logic 63 controls control circuitry 62 in order to perform the internal data transfer operation. When such an operation is required, internal data transfer logic 63 receives an internal data transfer command from the external circuitry via bus 65. The command is then decoded by internal data transfer logic 63. Logic 63 then causes control circuitry 62 to sequentially perform read and write operations to memory array 61.

Control circuitry 62 also receives information associated with the internal data transfer command via bus 65. The information includes the source and destination addresses of the data to be transferred and the size of the data. Under control of internal data transfer logic 63, control circuitry 62 first reads the data from memory array 61 at the source addresses. Control circuitry 62 buffers the data read from memory array 61 in page buffer 70. Internal data transfer logic 63 then causes control circuitry 62 to write (i.e., program) the data buffered in page buffer 70 into memory array 61 at the destination addresses.

For one embodiment, internal data transfer logic 63 implements a process that controls control circuitry 62 to read a byte or a word of data from memory array 61 at the source address to page buffer 70. Internal data transfer logic 63 then causes control circuitry 62 to write the byte or word of data buffered in page buffer 70 to memory array 61 at the destination address. Control circuitry 62 then increases the source and destination address to read the next byte or word of data from memory array 61. The next byte or word of data is then written into memory array 61 at the incremented destination address. The process is repeated until all the data is transferred. This process is described below, in conjunction with FIG. 5.

For another embodiment, internal data transfer logic 63 implements a process that causes control circuitry 62 to read all the data to be transferred from memory array 61 into page buffer 70. Internal data transfer logic 63 then controls control circuitry 62 to write all the data buffered in page buffer 70 into memory array 61 at the destination addresses. This process is described below, in conjunction with FIG. 4.

When internal data transfer logic 63 causes control circuitry 62 to perform the internal data transfer operation, the data to be transferred is not transferred to the external circuitry via bus 65. Instead, the data to be transferred is buffered in page buffer 70 before being written back into memory array 61. For example, when the data stored in sector 61a of BLOCKn is to be transferred to spare sector 61b of BLOCK 2, internal data transfer logic 63 receives the internal data transfer command. The addresses of sector 61a (i.e., the source addresses) are applied to control circuitry 62 via bus 65. The addresses of sector 61b (i.e., the destination addresses) are also applied to control circuitry 62. For one embodiment, control circuitry 62 only receives an initial source address of sector 61a at which the first portion of data is to be read and an initial destination address of sector 61b at which the first portion of data is to be stored. Control circuitry 62 then generates the remaining source and destination addresses by incrementing the initial source and destination addresses. This process stops when each of the final source and destination addresses generated is equal to the respective initial source or destination address plus the storage size of the data to be transferred.

When internal data transfer logic 63 receives the internal data transfer command, logic 63 decodes the command and causes control circuitry 62 to sequentially read the data stored in sector 61a and write the data into sector 61b.

Figure 4:
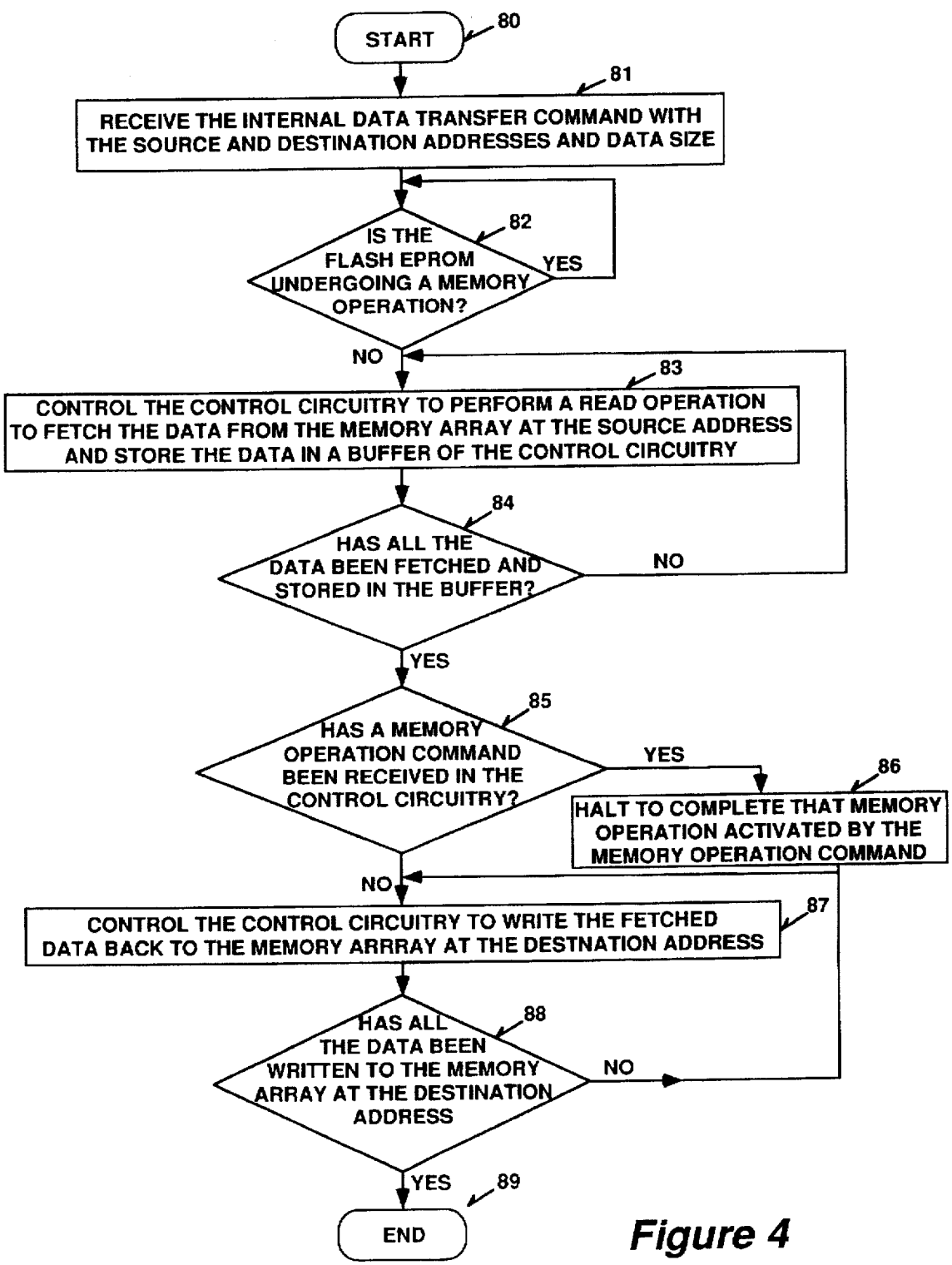
FIG. 4 is a flow chart diagram that shows one process implemented by the internal data transfer logic of FIGS. 2–3 for transferring data internally within the flash EPROM.
Figure 5:
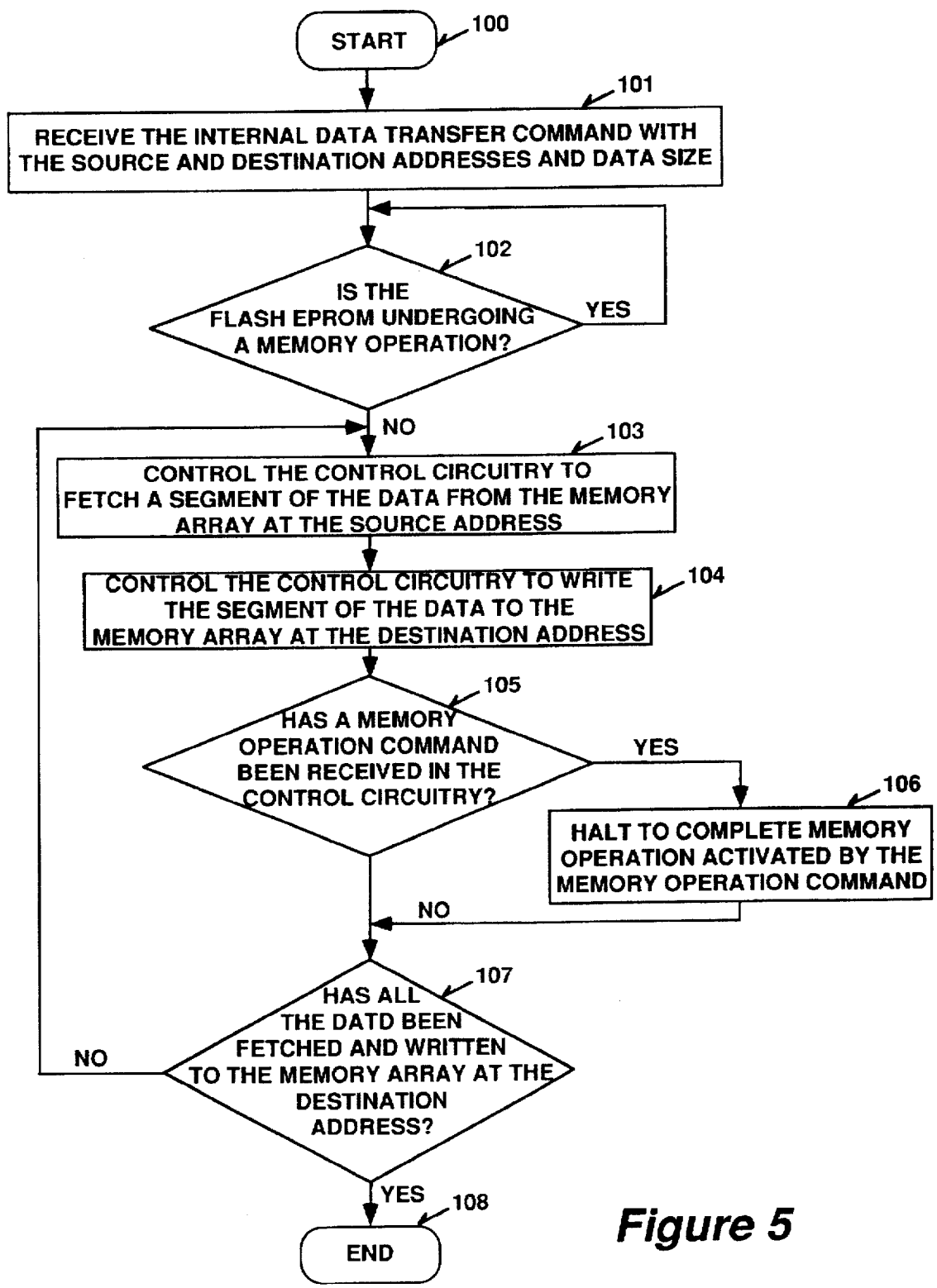
FIG. 5 is a flow chart diagram that shows another process implemented by the internal data transfer logic of FIGS. 2–3 for transferring data internally within the flash EPROM.

For one embodiment, internal data transfer logic 63 is implemented at the firmware level. For example, internal data transfer logic 63 is implemented by storing a set of instruction codes for controlling control circuitry 62 to perform the internal data transfer operation in a ROM circuit within flash EPROM 50. As a further example, internal data transfer logic 63 can be implemented by a programmable array logic circuit within flash EPROM 50. Further, internal data transfer logic 63 can be a register set that stores the internal data transfer command and controls control circuitry 62 based on contents it stores. FIGS. 4 and 5 are the flow chart diagrams of two processes implemented by internal data transfer logic 63, which will be described in more detail below.

Referring to FIG. 4, the process starts at step 80. At step 81, the internal data transfer command is received. The source and destination addresses and the storage size of the data to be transferred are also received. At step 82, a judgment is made to determine whether flash EPROM 50 is undergoing a memory operation. If so, step 82 is repeated. If flash EPROM 50 is not undergoing any memory operation, step 83 is then performed. At step 83, control circuitry 62 is controlled to read the data at the source addresses from memory array 61 into page buffer 70. At step 84, another judgment is made to determine whether all the data to be transferred has been read from memory array 61. If not, all the data has been read, step 83 is performed again. If all the data has been read from memory array 61, then step 85 is performed. At step 85, if a memory operation command is received in control circuitry 62, then the internal data transfer operation is halted to complete the memory operation activated by the memory operation command. If no memory operation command is received in control circuitry 62, step 87 is then performed. At step 87, control circuitry 62 is controlled to write the data buffered in page buffer 70 back into memory array 61 at the destination addresses. Step 88 is then performed at which a judgment is made to determine whether all the data buffered in page buffer 70 has been written back into memory array 61 at the destination addresses. If the answer is no, then step 87 is performed again. If all the data has been written into memory array 61, then the process ends at step 89.

FIG. 5 shows the flow chart of another process implemented by internal data transfer logic 63. Referring to FIG. 5, the process starts at step 100. At step 101, the internal data transfer command is received. In addition, the source and destination addresses and the storage size of the data to be transferred are also received. At step 102, a judgment is made to determine whether flash EPROM 50 is currently undergoing a memory operation, if so, step 102 is repeated. If flash EPROM 50 is not undergoing any memory operation, step 103 is performed. At step 103, control circuitry 62 is controlled to read a byte or a word of the data to be transferred from memory array 61 at the initial source address. The data byte or data word is then buffered in page buffer 70. At step 104, control circuitry 62 is controlled to write the data byte or data word back into memory array 61 at the initial destination address. At this step, the source and destination addresses are incremented to indicate to the next address location of the data byte or data word to be transferred. Step 105 is then performed to determine if a memory operation command is received in control circuitry 62. If the answer is yes, then step 106 is performed. At step 106, the internal data transfer operation is halted to allow the memory operation activated by the command to be performed. If control circuitry 62 does receive any memory operation command, then step 107 is performed. At step 107, a judgment is made to determine whether all the data has been transferred. If the answer is no, then the process returns to step 103. If the answer is yes, then the process ends at step 108.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory that resides on a single substrate, comprising:

(A) a memory array having a first block and a second block;

(B) control circuitry coupled to the memory array for performing a memory operation with respect to the memory array;

(C) a data transfer circuit coupled to the control circuitry and responsive to a data transfer command received from an external circuit for controlling the control circuitry to perform a data transfer operation to transfer data from the first block to the second block within the memory array without transferring the data to the external circuit; and (D) a buffer for buffering the data read from the first block before the data is written into the second block, wherein the control circuitry fetches the data from the buffer to store in the second block.

2. The memory of claim 1, wherein the data transfer circuit causes the control circuitry to perform the data transfer operation by (1) causing the control circuitry to fetch the data from the first block to the buffer and (2) then causing the control circuitry to store the data to the second block from the buffer.

3. The memory of claim 1, wherein the data transfer circuit enables the control circuitry to start the data transfer operation when the control circuitry is not performing the memory operation.

4. The memory of claim 3, wherein the control circuitry completes the data transfer operation when the control circuitry receives a memory operation command while undergoing the data transfer operation.

5. The memory of claim 3, wherein the control circuitry halts the data transfer operation when the control circuitry receives a memory operation command while undergoing the data transfer operation.

6. The memory of claim 1, wherein the memory array includes electrically erasable and programmable memory cells.

7. A computer system, comprising:

(A) a system bus;

(B) a central processing unit (CPU) coupled to the system bus;

(C) a memory coupled to the system bus, wherein the memory resides on a single substrate, wherein the memory further comprises (i) a memory array having a first block and a second block;

(ii) control circuitry coupled to the memory array for controlling a memory operation with respect to the memory array; and (iii) a data transfer circuit coupled to the control circuitry and responsive to a data transfer command received from the CPU for controlling the control circuitry to perform a data transfer operation to transfer data from the first block to the second block within the memory array without transferring the data to the system bus; and (iv) a buffer for buffering the data read from the first block before the data is written into the second block, wherein the control circuitry fetches the data from the buffer to store in the second block.

8. The computer system of claim 7, wherein the data transfer circuit further comprises an enabling circuit for enabling the control circuitry to start the data transfer operation when the control circuitry is not performing the memory operation.

9. The computer system of claim 7, wherein the memory array includes electrically erasable and programmable memory cells.

10. A method of transferring data within a memory device, comprising the steps of:

(a) reading the data stored in a first block of the memory device;

(b) storing the data read from the first block of the memory device in a buffer of the memory device; and (c) writing the data stored in the buffer into a second block of the memory device such that the data is transferred from the first block of the memory device to the second block of the memory device without leaving the memory device.

11. The method of claim 10, further comprising the steps of:

(d) determining if the memory device is currently undergoing a memory operation;

(e) waiting until the completion of the memory operation, if the memory device is currently undergoing a memory operation.

12. A method of transferring data within a memory device, comprising the steps of:

(a) reading a segment of the data stored in an address location of a first block of the memory device;

(b) storing the segment of the data read from the first block of the memory device in a buffer of the memory device; and (c) writing the segment of the data stored in the buffer into an address location of a second block of the memory device;

(d) returning to the step (a) if the segment is not a last segment of the data, wherein the data is transferred from the first block of the memory device to the second block of the memory device without leaving the memory device.

13. The method of claim 12, further comprising the steps of:

(d) determining if the memory device is currently undergoing a memory operation;

(e) waiting until the completion of the memory operation, if the memory device is currently undergoing a memory operation.

14. A memory array comprising:

at least a first and second block of memory; and a data transfer circuit for transferring data from the first block to the second block within the memory array such that no device or circuit outside the array need receive the data during the transfer; and a buffer receiving data from the first block, said buffer being used during transfer of the data to the second block, said array comprising all circuits necessary for data transfer.

15. The memory array of claim 14, further including a buffer receiving data from the first block, said buffer being used during transfer of the data to the second block, said array comprising all circuits necessary for data transfer.

16. The memory array of claim 14, further including a control circuit that receives a data transfer instruction from outside the memory array, the instruction having a pointer to the first block and a pointer to the second block, said memory array performing a data transfer from said first block to said second block in response to said data transfer instruction when said blocks are not otherwise being accessed.

* * * * *